United States Patent

Sakai et al.

[11] Patent Number: 6,077,477
[45] Date of Patent: *Jun. 20, 2000

[54] SOLDER ALLOY OF ELECTRODE FOR JOINING ELECTRONIC PARTS AND SOLDERING METHOD

[75] Inventors: Yoshinori Sakai, Hirakata; Kenichiro Suetsugu, Nishinomiya; Atsushi Yamaguchi, Minou, all of Japan

[73] Assignee: Matsushita Electric Industrial Co., Ltd., Osaka, Japan

[*] Notice: This patent is subject to a terminal disclaimer.

[21] Appl. No.: 09/011,393
[22] PCT Filed: Jun. 6, 1997
[86] PCT No.: PCT/JP97/01969
  § 371 Date: Feb. 5, 1998
  § 102(e) Date: Feb. 5, 1998
[87] PCT Pub. No.: WO97/46350
  PCT Pub. Date: Dec. 11, 1997

[30] Foreign Application Priority Data

Jun. 6, 1996 [JP] Japan ................... 8-143905

[51] Int. Cl.$^7$ .................................................. C22C 13/02
[52] U.S. Cl. ............................. 420/560; 420/561
[58] Field of Search .................. 420/560, 561; 148/400, 405

[56] References Cited

U.S. PATENT DOCUMENTS

| | | | |
|---|---|---|---|
| 4,643,875 | 2/1987 | Mizuhara | 420/560 |
| 4,695,428 | 9/1987 | Ballentine et al. | 420/561 |
| 5,352,407 | 10/1994 | Seelig et al. | 420/561 |
| 5,393,489 | 2/1995 | Gonya et al. | 420/561 |
| 5,520,752 | 5/1996 | Lucey et al. | 420/561 |
| 5,527,628 | 6/1996 | Anderson et al. | 420/560 |
| 5,863,493 | 1/1999 | Achari et al. | 420/561 |
| 5,918,795 | 7/1999 | Yamaguchi et al. | 420/561 |

FOREIGN PATENT DOCUMENTS

| | | |
|---|---|---|
| 7-88680 | 4/1995 | Japan . |
| 7-88681 | 4/1995 | Japan . |
| 8-215880 | 8/1996 | Japan . |

OTHER PUBLICATIONS

International Search Report corresponding to PCT/JP97/01969 dated Sep. 9, 1997.
Form PCT/ISA/210.

*Primary Examiner*—George Wyszomierski
*Attorney, Agent, or Firm*—Ratner & Prestia

[57] ABSTRACT

A lead-free solder alloy of electrode for joining electronic parts fine in texture and excellent in thermal fatigue resistant characteristic is presented. This is a solder alloy for joining electronic parts comprising Sn, Ag, Bi, Cu and In as principal components, and more particularly a solder alloy of electrode for joining electronic parts containing 81 to 91 wt. % of Sn, 3.0 to 6.0 wt. % of Ag, and 0.1 to 2.0 wt. % of Cu. By adding a small amount of Ag to the solder mainly composed of Sn, a fine alloy texture is formed, and texture changes are decreased, so that an alloy excellent in thermal fatigue resistance is obtained. Further, by adding a small amount of Cu, an intermetallic compound is formed, and the junction strength is improved.

4 Claims, 2 Drawing Sheets

SOLDER ALLOY OF ELECTRODE FOR JOINING ELECTRONIC PARTS AND SOLDERING METHOD

This application is a U.S. National Phase Application of PCT International Application PCT/JP97/01969.

TECHNICAL FIELD

The present invention relates to a solder alloy of electrode surface for joining electronic parts for mounting parts on an electronic circuit board, and its soldering method.

BACKGROUND ART

In the recent electronic parts mounting technology, products using electronic circuit boards mounting electronic parts are increasing in number. In this background, there is a mounting demand for enhancement of mechanical junction strength of soldered parts, increase of thermal impact strength, and higher reliability. On the other hand, while the concern about the global environmental protection is attracting attention, statutory restrictions are being considered about disposal of industrial refuse such as electronic circuit boards.

An outline of solder alloy of electrode surface for solder junction of electronic parts and its soldering method of a prior art is described below while referring to drawings. FIG. 1 is an outline drawing showing an electrode composition of a conventional electrode for joining electronic parts, and FIG. 2 is a metal composition diagram of the junction interface of a conventional electrode for joining electronic parts.

In FIG. 1, reference numeral 3 is Sn—Pb, 4 is Ni, and 5 is Ag, and they are solder alloys, and compose an electrode of an electronic part 6. In particular, as the electrode surface material, an alloy of Sn and Pb is used. In the metal composition diagram of the junction interface of the electrode for joining electronic parts in FIG. 2, reference numeral 1 is an α-solid solution, being in Sn-rich phase. Reference numeral 2 is a β-solid solution, being in Pb-rich phase. In such conventional solder alloy, the metal composition on the electrode surface is composed of 90 wt. % of Sn and 10 wt. % of Pb, and its melting point is 183° C. to 210° C. When soldering such electrode with a solder a alloy of metal for junction, its alloy composition is a lamellar form of α-solid solution 1 and β-solid solution 2.

In conventional soldering, the solder alloy of electrode for solder junction of electronic parts had such problems. When soldered by the solder alloy for junction, the alloy composition became lamellar. In particular, when exposed repeatedly to high temperature environments, the texture was swollen, and hence when a stress is applied to the solder, slipping occurred on the texture interface, which resulted in solder cracks.

Or, from the viewpoint of environmental protection, the regulation of lead contained in the solder alloy (Sn—Pb alloy) is being promoted, and when the refuse of electronic circuit board soldered by the conventional solder alloy is exposed to acid rain, lead is eluted massively, and this eluate is known to have an adverse effect on the human health.

In the light of the above problems, it is an object of the invention to present an electrode surface constitution of an electronic part by a solder alloy, free from lead in the solder junction area, in soldering of electronic parts, ultra-fine in the alloy texture of the junction area, and excellent in repeated thermal fatigue characteristic in high temperature environments.

DISCLOSURE OF THE INVENTION

The solder alloy of electrode for joining electronic parts of the invention is a solder alloy mainly composed of Sn, Ag and Cu, and it is characterized that the ratio by weight of components is 92 to 96 wt. % of Sn, 3.5 to 6.0 wt. % of Ag, and 0.5 to 2.0 wt. % of Cu. In this constitution, by adding small amounts of Ag and Cu to the solder mainly composed of Sn, a solder alloy excel lent in thermal fatigue resistant characteristic and mechanical junction strength is obtained.

BEST MODE FOR CARRYING OUT THE INVENTION

Figure 1:
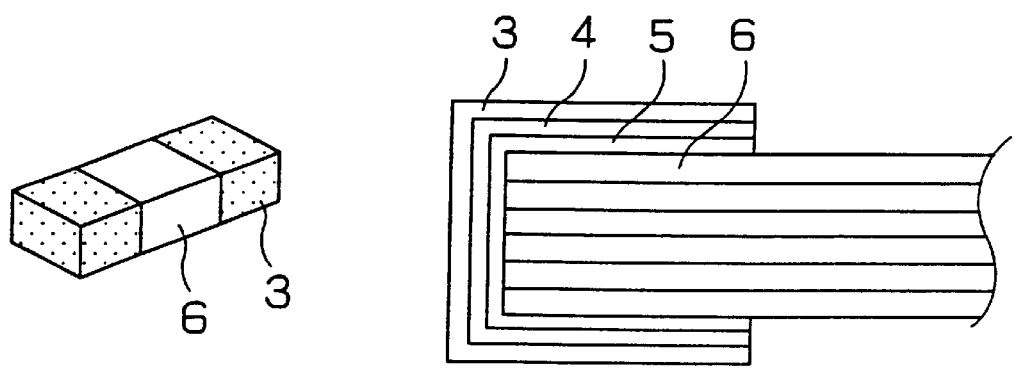
FIG. 1 is an outline drawing showing an electrode constitution of an alloy for joining electronic parts in a prior art.
Figure 2:
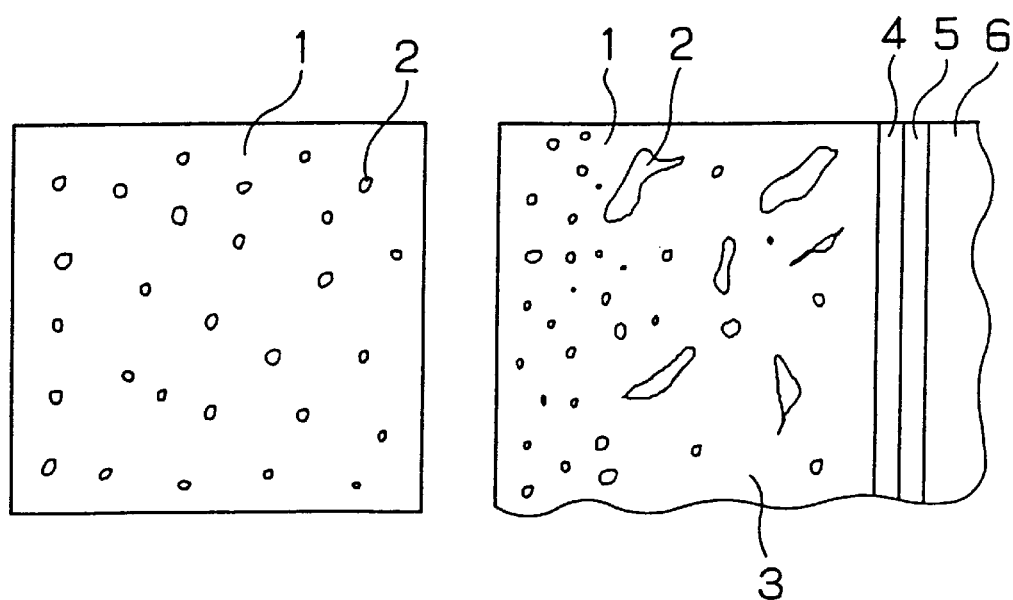
FIG. 2 is a metal composition diagram on the junction interface of an alloy for joining electronic parts in a prior art.

A solder alloy of an electrode for joining electronic parts in accordance with an exemplary embodiment of the invention is mainly composed of Sn, Ag and Cu, and the ratio by weight of each component is 92 to 97 wt. % of Sn, 3.0 to 6.0 wt. % of Ag, and 0.1 to 2.0 wt. % of Cu. By adding a small amount of Ag to the solder mainly composed of Sn, an alloy having a fine alloy texture and an excel lent thermal fatigue resistant characteristic is obtained, and the melting point can be raised, too. Further by adding a small amount of Cu, an intermetallic compound is formed, and the mechanical junction strength is enhanced.

A solder alloy of an electrode for joining electronic parts in accordance with another embodiment of the invention is mainly composed of Sn, Ag, Bi, Cu, and In, and the ratio by weight of each component is 81 to 91% of Sn, 3.0 to 6.0 wt. % of Ag, 5 to 10 wt. % of Bi, 0.1 to 2.0 wt. % of Cu, and 0.1 to 1.0 wt. % of In. In addition to the features of claim 1, by adding a small amount of Bi, the wettability is improved. Also by adding a slight amount of In, the elongation characteristic and thermal fatigue resistant characteristic of the alloy can be improved.

In accordance with another embodiment of the invention, there is a soldering method of an electrode for joining electronic parts constituted in the alloy solder as described above. In this soldering method, in the solidifying process at the time of soldering, it is a feature to quench and solidify at a temperature gradient of 5° C./sec to 15° C./sec from top temperature to preheat temperature. In the solidifying process at the time of soldering, by quenching and solidifying, since metal compounds of $Ag_3Sn$, $Cu_3Sn$, and $Cu_6Sn_5$ are dispersed finely, the mechanical strength and thermal fatigue resistant characteristic can be enhanced.

Embodiments of the invention are described below.

The reason of thus limiting the composition of the solder alloy in the invention is described below.

Ag improves the thermal fatigue resistant characteristic. However, if its addition is less than 3.0 wt. %, its effect is not sufficient. Besides, to maintain the melting point above 220° C. and below 250° C., the addition of Ag must be 6.0 wt. % or less. If Ag is added more than 6.0 wt. %, the melting point elevates suddenly, which is not preferred. Therefore, a preferred addition of Ag is 3.0 to 6.0 wt. %.

Bi improves the wettability. If the addition of Bi is less than 5 wt. %, its effect is not sufficient. If the addition of Bi is more than 18 wt. %, soldering strength is not obtained, which is not preferred. Therefore, a preferred addition of Bi is 5 to 18 wt. %.

Cu improves the high temperature characteristic, and is effective to enhance the mechanical strength as bonding material. If the addition of Cu is less than 0.1 wt. %, its effect is insufficient. If added more than 2.0 wt. %, it becomes stiff and brittle, and the characteristic deteriorates. Therefore, a preferred addition of Cu is 0.1 to 2.0 wt. %.

In is effective to improve the elongation characteristic, wettability, and thermal fatigue resistant characteristic. If the addition of In is less than 0.1 wt. %, its effect is insufficient. If added more than 1.0 wt. %, the mechanical strength of the alloy deteriorates. Therefore, a preferred addition of In is 0.1 to 1.0 wt. %.

Embodiments are made specifically described below by referring to Table 1 and Table 2.

TABLE 1

|  |  | Embodiment | | Comparative example | |
|---|---|---|---|---|---|
|  |  | 1 | 2 | 1 | 2 |
| Composition | Sn | 94.5 | 89.5 | 96.5 | 63 |
| (wt. %) | Ag | 5.0 | 3.0 | 3.5 |  |
|  | Bi |  | 5 |  |  |
|  | Cu | 0.5 | 1.5 |  |  |
|  | In |  | 1 |  |  |
|  | Pb |  |  |  | 37 |
| Melting point (° C.) |  | 237~245 | 214~231 | 221 | 183 |
| Wettability (%) |  | 87.8 | 88.8 | 84 | 89.8 |
| Junction strength (kgf) |  | 1.0 | 1.3 | 1.3 | 1.0 |
| Thermal impact test |  | OK | OK | OK | OK |

TABLE 2

|  |  | Solder material for junction | |
|---|---|---|---|
|  |  | 1 | 2 |
| Compositon | Sn | 90.5 | 80.8 |
| (wt. %) | Ag | 3.5 | 3 |
|  | Bi | 6 | 15 |
|  | Cu |  | 0.5 |
|  | In |  | 1.0 |
|  | Pb |  |  |
| Melting point (° C.) |  | 210~216 | 187~201 |
| Wettability (%) |  | 88.9 | 89.1 |
| Junction strength (kgf) |  | 1.0 | 1.3 |
| Thermal impact test |  | OK | OK |

Table 1 shows results of comparison of composition, melting point, wettability, junction strength, and thermal impact characteristic of solder alloys of embodiments 1 and 2 of the invention, and solder alloys of comparative examples 1 and 2.

The melting point was measured by thermal analysis of each solder alloy.

The wettability, junction strength and thermal impact were tested by preparing each solder alloy in a form of cream solder of RMA type for atmosphere.

As for wettability, after mounting an OFP at 0.5 mm pitch, the peeling strength per lead was measured.

In thermal impact test, using a vapor phase type thermal impact tester, thermal impact was repeated 500 cycles in the test condition of −40° C. (30 minutes), followed by ordinary temperature (5 minutes) and then 80° C. (30 minutes), and presence or absence of crack was evaluated.

When preparing the solder alloy into a cream solder, the type of flux was not particularly specified, and fluxes of atmospheric reflow type, nitrogen reflow type, RA type, RMA type, etc. were usable. Preferably, the atmospheric RMA type flux was suited owing to vital activity and relatively excellent resistance to corrosion.

Comparative example 1 is a solder alloy of 96.5 wt. % of Sn and 3.5 wt. % of Ag, and comparative example 2 is a solder alloy of 63 wt. % of Sn and 37 wt. % of Pb.

The solder alloy as junction metal was a solder alloy shown in Table 2.

(Embodiment 1)

The solder alloy in embodiment 1 is a three-component solder alloy comprising 94.5 wt. % of Sn, 5.0 wt. % of Ag, and 0.5 wt. % of Cu.

This solder alloy was prepared into a cream solder by using atmospheric RMA type flux, and the melting point, wettability, junction strength, and thermal impact were tested. Results are shown in Table 1. Although not shown in Table 1, the result of tensile strength test of solder was 8.3 kgf/mm$^2$. Comparing with the similar test result of comparative example 2 of 6.5 kgf/mm$^2$, a notable improvement was also recognized in the tensile strength.

In the solidifying process when soldering, when the solder was quenched and solidified, growth of intermetallic compound ($Ag_3Sn$) was suppressed, and it was dispersed finely, and hence the mechanical strength was elevated and the thermal fatigue resistant characteristic was improved. In the α-solid solution and β-solid solution, similarly, the texture was finely formed.

The means for quenching and solidifying was cold air blowing method, and the solder area was cooled at a cooling rate of about 10° C./second.

(Embodiment 2)

The solder alloy in embodiment 2 is a five-component solder alloy comprising 89.5 wt. % of Sn, 3 wt. % of Ag, 5 wt. % of Bi, 1.5 wt. % of Cu, and 1 wt. % of In.

Test results are as shown in Table 1. As clear from Table 1, as compared with embodiment 1, the melting point was lowered and the junction strength was increased.

The solder alloy of embodiment 2 was also quenched and solidified when soldering. As a result, same as in embodiment 1, the mechanical strength was increased and thermal impact resistant characteristic was improved.

As the quenching and solidifying means, as mentioned in embodiment 1, cold air blowing method was preferred, and the cooling rate was preferred at 5 to 15° C./second, and more preferably around 10° C./second.

Moreover, since produced metal oxides such as $Ag_3Sn$, $Cu_3Sn$, and $Cu_6Sn_5$ were finely dispersed by quenching and solidifying, the mechanical strength and thermal fatigue resistant characteristic were enhanced.

INDUSTRIAL APPLICABILITY

As clear from the description herein, the solder alloy of electrode for joining electronic parts of the invention contains a solder mainly composed of Sn, and a small amount of added Ag. In this composition, the alloy texture is fine and texture changes are small, so that an alloy excellent in thermal fatigue resistant characteristic is obtained. By further adding a small amount of Bi, the wettability can be improved. Also by adding a small amount of Cu, an intermetallic compound is formed, and the junction strength is improved. By adding a small amount of In, the elongation characteristic of the alloy is improved, and the thermal fatigue resistant characteristic can be improved.

Moreover, in the cooling process of soldering, by quenching and solidifying, the solder alloy texture is finely formed and dispersed, and hence a solder alloy excellent in mechanical strength and thermal fatigue resistant characteristic can be obtained. Still more, since a lead-free electrode for joining electronic parts is presented, lead-free soldering is possible on the entire junction by joining with the solder alloy as shown in Table 2 which is a lead-free junction metal.

What is claimed is:

1. A solder alloy for joining electronic parts comprising Sn, Ag, Bi, Cu and In as principal components, wherein the ratio by weight of each component is 81 to 91 wt. % of Sn, 3.0 to 6.0 wt. % of Ag, 5 to 10 wt. % of Bi, 0.1 to 2.0 wt. % of Cu, and 0.1 to 1.0 wt. % of In.

2. A solder alloy as recited in claim 1, wherein the ratio by weight of each component is 81 to 91 wt. % of Sn, greater than 4.0% and less than or equal to 6.0 wt. % of Ag, 5 to 10 wt. % of Bi, greater than 0.7 wt. % and less than or equal to 2.0 wt. % of Cu. and 0.1 to 1.0 wt. % of In.

3. A solder alloy as recited in claim 1, wherein the ratio by weight of each component is 81 to 91 wt. % of Sn, 4.0% to 6.0 wt. % of Ag, 5 to 10 wt. % of Bi, greater than 0.7 wt. % and less than or equal to 2.0 wt. % of Cu, and 0.1 to 1.0 wt. % of In.

4. A solder alloy as recited in claim 1, wherein the ratio by weight of each component is 81 to 91 wt. % of Sn, greater than 4.0% and less than or equal to 6.0 wt. % of Ag, 5 to 10 wt. % of Bi, 0.1 to 2.0 wt. % of Cu, and 0.1 to 1.0 wt. % of In.

* * * * *